United States Patent
Fronte et al.

(10) Patent No.: US 10,998,306 B2
(45) Date of Patent: May 4, 2021

(54) PROTECTION OF AN INTEGRATED CIRCUIT

(71) Applicant: STMicroelectronics (Rousset) SAS, Rousset (FR)

(72) Inventors: Daniele Fronte, Rousset (FR); Pierre-Yvan Liardet, Peynier (FR); Alexandre Sarafianos, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 325 days.

(21) Appl. No.: 16/100,796

(22) Filed: Aug. 10, 2018

(65) Prior Publication Data

US 2019/0051643 A1    Feb. 14, 2019

(30) Foreign Application Priority Data

Aug. 11, 2017   (FR) ...................................... 1757674

(51) Int. Cl.
*H01L 27/02*   (2006.01)
*G01R 31/28*   (2006.01)
*H01L 23/00*   (2006.01)

(52) U.S. Cl.
CPC ...... *H01L 27/0248* (2013.01); *G01R 31/2879* (2013.01); *H01L 23/57* (2013.01); *H01L 23/573* (2013.01); *H01L 23/576* (2013.01)

(58) Field of Classification Search
CPC ... H01L 27/0248; H01L 23/573; H01L 23/57; H01L 23/576; G01R 31/2879; G06F 21/60
See application file for complete search history.

(56) References Cited

U.S. PATENT DOCUMENTS

| | | | |
|---|---|---|---|
| 5,291,434 A | 3/1994 | Kowalski | |
| 10,600,742 B2* | 3/2020 | Kuenemund | ........ H03K 3/0375 |
| 2011/0029828 A1 | 2/2011 | Bancel et al. | |
| 2011/0210782 A1* | 9/2011 | Kuenemund | ....... H01L 31/1113 |
| | | | 327/493 |
| 2014/0103485 A1 | 4/2014 | Fritz et al. | |
| 2015/0130506 A1 | 5/2015 | Bhunia et al. | |
| 2020/0273818 A1* | 8/2020 | Forte | ............... H01L 21/823807 |

FOREIGN PATENT DOCUMENTS

| | | |
|---|---|---|
| CN | 101107709 A | 1/2008 |
| CN | 105391542 A | 3/2016 |
| CN | 205069628 U | 3/2016 |
| CN | 205752158 U | 11/2016 |

OTHER PUBLICATIONS

Saraswat, "MOS Gate Dielectrics", Stanford University, EE311 / Gate Dielectric, Slideshow Presentation, 2005, 21 pages.

* cited by examiner

*Primary Examiner* — Kyle J Moody

(74) *Attorney, Agent, or Firm* — Seed IP Law Group LLP

(57) ABSTRACT

A circuit for protecting an integrated circuit against fault injection attacks includes an element including a dielectric which is destroyed, resulting in the occurrence of a short-circuit. The element is connected between two terminals that receive a power supply voltage of the integrated circuit.

20 Claims, 2 Drawing Sheets

PROTECTION OF AN INTEGRATED CIRCUIT

BACKGROUND

Technical Field

The present disclosure generally relates to electronic circuits and, more particularly, to a mechanism for protecting an integrated circuit against fault injection attacks of a laser attack type.

Description of the Related Art

In many applications, electronic circuits implement algorithms of encryption, authentication, signature calculation, and more generally algorithms manipulating data, called secret data, the access to which is desired to be reserved to certain users or circuits.

There exist many methods, called attacks, to attempt discovering or pirating secret data manipulated by such calculations. Among such attacks, so-called fault injection attacks disturb the circuit operation in order to then process direct information (the circuit inputs-outputs) or indirect information (so-called side channel attacks). The interpretation of such information gives a pirate information relative to the secret data.

Different categories of fault injection attacks are known. Some are electric (disturbance of the circuit power supply), others use sources of a radiation, for example, an electromagnetic or photonic radiation (laser attack).

Current countermeasures act, after the attack has been detected, either by resetting the circuit, or by blocking the circuit operation.

There is a need to improve countermeasures to fault injection attacks and detection of such attacks, particularly by laser attack.

BRIEF SUMMARY

An embodiment overcomes all or part of the disadvantages of usual methods and circuits of protection of an integrated circuit against fault injections.

An embodiment provides a solution particularly adapted to laser attacks.

Thus, an embodiment provides a circuit for protecting an integrated circuit against fault injection attacks including an element comprising a dielectric which fails or destroys, causing the occurrence of a short-circuit connected between two terminals intended to receive a power supply voltage of the integrated circuit.

According to an embodiment, the element is a MOS transistor having conduction terminals connected to the two power supply terminals.

According to an embodiment, the destruction of the dielectric is performed by trap-assisted tunneling.

According to another embodiment, the circuit also comprises at least one fault detector controlling a progressive destruction of the element.

According to an embodiment, the detector controls the application of electric stress onto the dielectric of the element.

According to an embodiment, the detector comprises at least one element sensitive to photon radiation.

An embodiment provides a circuit of protection against laser attacks.

An embodiment provides a method of protecting an integrated circuit against fault injection attacks, wherein a progressive destruction of an element comprising a dielectric which is destroyed, resulting in the occurrence of a short-circuit.

According to an embodiment, the duration and the intensity of the progressive destruction depend on the duration and on the intensity of the attack.

An embodiment provides an integrated circuit comprising at least one protection circuit.

The foregoing and other features and advantages will be discussed in detail in the following non-limiting description of specific embodiments in connection with the accompanying drawings.

DETAILED DESCRIPTION

Figure 1:
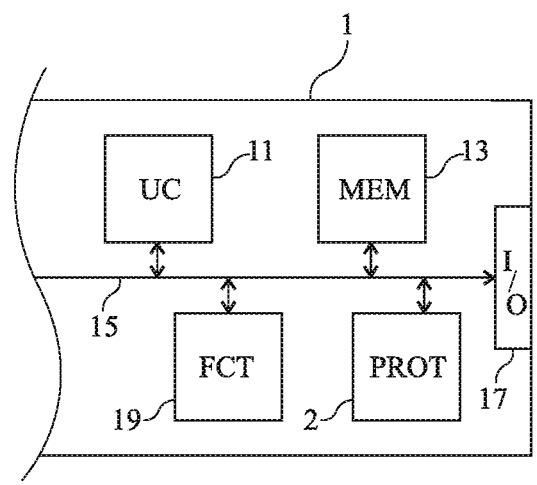
FIG. 1 schematically shows an embodiment of an integrated circuit including a protection circuit according to the present disclosure.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the embodiments which will be described have been shown and will be detailed. In particular, the final application of the protected circuit has not been detailed, the described embodiments being compatible with usual applications.

Unless otherwise specified, when reference is made to two elements connected to each other, this means directly connected with no intermediate element other than conductors, and when reference is made to two elements coupled to each other, this means that the two elements may be directly coupled (connected) or coupled via one or a plurality of other elements.

In the following description, expressions "approximately", "substantially", and "in the order of" mean to within 10%, preferably to within 5%.

FIG. 1 very schematically shows an embodiment of an integrated circuit 1 of the type to which the embodiments which will be described apply.

The integrated circuit 1 comprises:

a calculation unit or processor 11 (UC), for example, a state machine, a microprocessor, a programmable logic circuit, etc.;

one or a plurality of volatile and/or non-volatile storage areas or memory 13 (MEM) for storing all or part of the data and programs;

one or a plurality of data, address, and/or control buses 15 between the different elements internal to circuit 1;

an input-output interface 17 (I/O) for communicating with the outside of circuit 1; and various other circuits according to the application, symbolized in FIG. 1 by a block 19 (FCT).

According to the illustrated embodiment, the integrated circuit 1 further comprises a protection circuit 2 (PROT) for protection against fault injection attacks.

Circuits manipulating quantities considered as secret are often sensitive to fault injections and, in particular, to laser attacks. A laser attack comprises directing the beam of a laser, generally from the back side of the integrated circuit, onto a specific area of the circuit to modify the behavior thereof and, more particularly to modify the state of certain bits. According to the accuracy of the laser beam, attacks are more or less accurate on given bits. Existing countermeasures against laser attacks succeed in detecting the attack, typically by means of photon radiation detectors.

However, existing countermeasures either disable the circuit when such an attack is detected, or reset it. In the first case, this results in destroying or disabling circuits sometimes in the presence of a false detection or of an isolated attack with no consequence on detecting the secret data. In the second case, this does not prevent successive attacks and makes the secret contained in the circuit more vulnerable.

The described embodiments provide an irreversible but progressive destruction of an element of the integrated circuit to forbid the operation thereof after several detected fault injection attacks.

It could have been devised an approach to store a counter in a non-volatile memory to forbid the use after a given number of attacks are detected. This, however, does not guarantee that the circuit will be made non-functional.

According to the described embodiments, the progressive and irreversible destruction of an element comprising a dielectric between two power supply terminals of the circuit is provided. Thus, once this element has been destroyed, the power supply terminals are shorted, which prevents any subsequent use of the circuit.

The case of laser attacks is considered hereafter. However, all that is described more generally applies to any type of fault injection.

Figure 2:
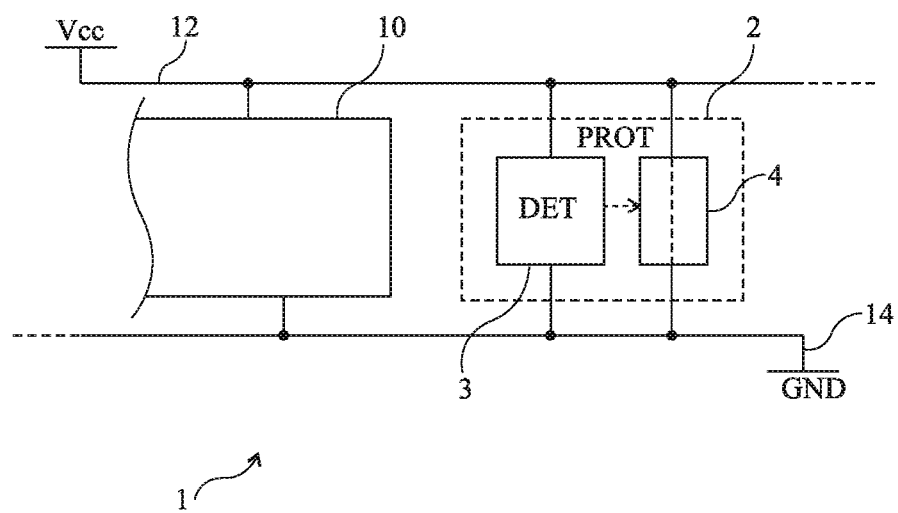
FIG. 2 schematically shows in the form of blocks an embodiment of an integrated circuit protection circuit.

FIG. 2 schematically shows in the form of blocks an embodiment of a protection circuit 2 for protecting the integrated circuit 1 of FIG. 1.

The different components of the integrated circuit 1 of FIG. 1, symbolized by a block 10 in FIG. 2, are powered with a voltage Vcc intended to be applied between two terminals or rails 12 and 14. The block 10 includes, for example, the processor 11, the memories 13, and the various other circuits of the block 19, of the integrated circuit of FIG. 1.

According to an embodiment, the protection circuit 2 comprises:

a detection circuit or block (DET) 3 for detecting a fault injection attack; and a countermeasure block 4, controlled by the detection block 3 and forming the actual countermeasure.

The countermeasure block 4 comprises an element comprising a dielectric, directly connected between the terminals 12 and 14, the dielectric being selected for specific electric characteristics. Because of these characteristics, the dielectric is weakened or partially destroyed when a power (voltage or current) greater than a threshold is applied thereto, and when this destruction is performed the dielectric transitions towards a short-circuit state. Thus, by properly sizing the thickness of the dielectric and the power which is applied thereto for each fault detection by the detection block 3, the number of faults can be controlled before the integrated circuit is disabled.

The detection block 3 comprises detection elements capable of being excited by a photon radiation, associated with a circuit of detection with respect to a threshold and with a circuit capable of causing a temporary overvoltage at the countermeasure element 4 to cause the destruction and shorting of the countermeasure element.

Most systems using destructions of components generate destructions of the component that result in an open circuit. Now, here, an opposite effect, that is, a destruction resulting in a short-circuit is desired. This guarantees a real disabling of integrated circuit 1 since this short-circuit is across the power supply rails 12, 14 of the circuit, which can then no longer be powered.

Figure 3:
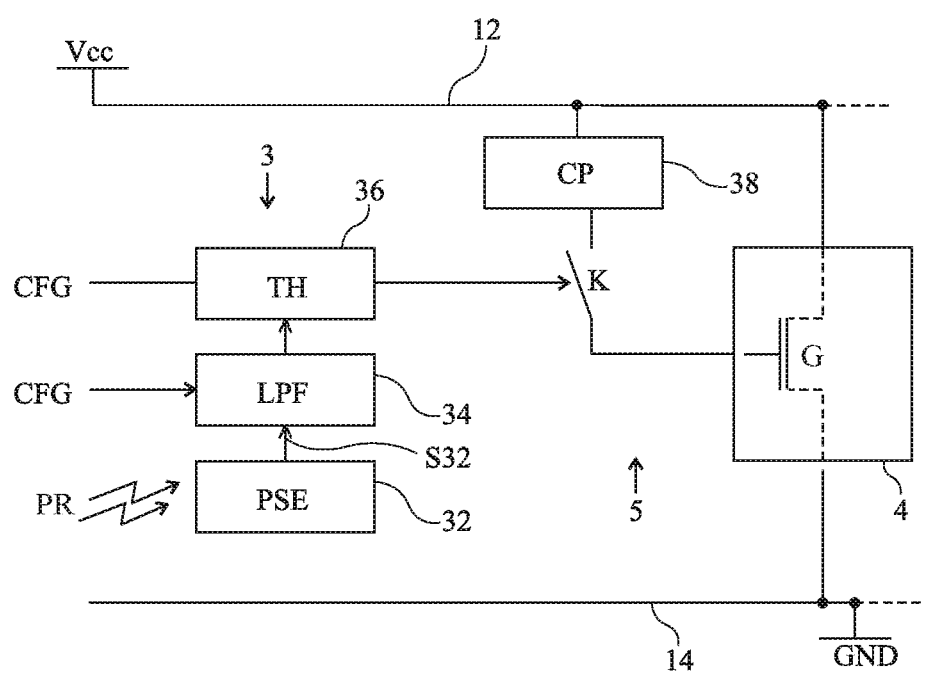
FIG. 3 is a more detailed functional block diagram of the protection circuit of FIG. 2.

FIG. 3 very schematically shows in the form of blocks a more detailed embodiment of the protection circuit 2 of FIG. 2.

The countermeasure element 4 includes a dielectric which, when destroyed, results in the occurrence of a short-circuit. The countermeasure element 4 may be formed by different components or structures, and is formed of a field-effect transistor G having its conduction terminals (source and drain) connected to the rails 12 (Vcc) and 14 (GND) in the embodiment of FIG. 3. Advantage is taken from the known effect of progressive degradation of the gate dielectric of the field-effect transistor G by trap-assisted tunneling (TAT). As will be understood by those skilled in the art, by applying a significant electric field to the gate of a MOS transistor, irreversible defects (traps) are created in the dielectric. The propagation of such defects mainly occurs across the thickness of the dielectric, which weakens as electric stress in the form of the electric field is applied (in time or intensity), until the transistor is turned into a permanently turned on (shorted) transistor.

This characteristic of progressive degradation of the gate oxide is used to form the protection or countermeasure element 4. The degradation of the gate oxide is caused by the detection of a radiation originating from a laser attack from the back side of the integrated circuit 1 to be protected.

The protection circuit 2 comprises, in addition to countermeasure element 4, a trigger element or detection circuit 3 that controls the progressive destruction of the oxide of countermeasure element 4.

The detection circuit 3 comprises one or a plurality of photon-sensitive elements 32 (PSE). These photon-sensitive elements 32 are activated by photonic radiation PR, particularly from a laser attack. In one embodiment, the photon-sensitive elements 32 are currently distributed across the surface of the integrated circuit 1 according to areas of the integrated circuit to be protected, and with a mesh size and a density which are a function of the application. The photo-sensitive elements 32 supply an electric signal S32 representative of detection of a photon when the elements are excited. This signal S32 is preferably filtered by a low-pass filter circuit (LPF) to avoid taking into account or detecting parasitic phenomena capable of generating detection errors. The selection of the duration of the pulses not to be considered depends on the application and is a part of a typical detector. Preferably, the detection circuit 3 further comprises an intensity detector 36 (TH) that measures (indirectly) the intensity of the photonic radiation received by the photon-sensitive elements 32 relative to a threshold, and is configured to generate an output to trigger deterioration of the countermeasure element 4 in response to detecting the occurrence of an attack. The adjustment of the threshold also depends on the application.

An output of detection circuit 3 controls, for example, a switch K coupled to provide application of a destruction signal onto the gate of the transistor of countermeasure element 4. For example, the switch K is interposed between an output of a charge pump 38 (CP) powered with the voltage Vcc and the gate of the transistor of countermeasure element 4. According to another example embodiment, the intensity detector 36 directly controls the charge pump 38, which has in this embodiment an output coupled directly to the countermeasure element 4.

In the presence of a laser attack detected by detection circuit 3, a strong or high power signal (typically, a high voltage relative to the voltage Vcc) is applied to the gate of countermeasure element 4 and deteriorates the gate oxide of the MOS transistor forming this element in the embodiment of FIG. 3.

The longer the laser attack, the greater the deterioration of the gate oxide or dielectric. Similarly, the greater the voltage applied by charge pump 38, the greater the deterioration of the gate oxide or dielectric.

The sizing of the detection circuit 3 and particularly of the trigger threshold defined by the intensity detector 36, as well as of the power applied to countermeasure element 4 in response to detecting the occurrence of an attack, depends on the application and particularly on the desired tolerance to attacks before the integrated circuit 1 is disabled by shorting of the countermeasure element 4, and also depends on the characteristics of the countermeasure element 4, e.g., on the voltage Vcc supplied to the element, etc. The selection of these parameters is within the abilities of those skilled in the art.

An advantage of the provided solution is that it avoids disabling an integrated circuit which has been submitted to one or a plurality of disturbances considered as negligible for the risk of security of the information manipulated by the circuit. Unlike usual solutions which provide a disabling of an integrated circuit, the described solution is more reliable since it requires no counter-type programming, which might be detected by a pirate to prevent the countermeasure from operating. Here, the countermeasure is immediately active during the attack. However, due to the progressive destruction of the countermeasure element, an effect similar to that of a counter is obtained by allowing a number of disturbances before the integrated circuit is disabled.

Another advantage of the described solution is that it takes into account not only the number of attacks, but also the durations of the attacks.

Another advantage is that, since it is associated with the destruction of a shorted component, the activation of the protection is definitive and it cannot be canceled. Embodiments of the present disclosure need not provide all of these advantages.

Various embodiments have been described. Various alterations, modifications, and improvements will readily occur to those skilled in the art. In particular, the selection of the thresholds, durations of application of the stress to the transistor gate, etc., depend on the application and may vary. They may, in certain applications, be made parameterizable by configuration signals. Finally, the practical implementation of the described embodiments is within the abilities of those skilled in the art based on the functional indications given hereabove, using adapted photon detectors and transistors or other elements to form the countermeasure element, which are conventional.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited to the disclosure.

What is claimed is:

1. A protection circuit, comprising:
   a detection circuit configured to detect a fault injection attack against an integrated circuit and to provide an output in response to detecting a fault injection attack; and
   an element including a dielectric connected between two power supply terminals of the integrated circuit configured to receive a power supply voltage, the dielectric configured to be destroyed in response to the output of the detection circuit to provide a short-circuit between the two terminals.

2. The protection circuit of claim 1, wherein the element comprises a MOS transistor having conduction terminals connected to the two power supply terminals.

3. The protection circuit of claim 1, wherein the dielectric is destroyed through trap-assisted tunneling.

4. The protection circuit of claim 1, further comprising at least one fault detector controlling a progressive destruction of the element.

5. The protection circuit of claim 4, wherein the detection circuit is configured to provide the output to control application of an electric stress onto the dielectric of the element.

6. The protection circuit of claim 4, wherein the detection circuit comprises at least one photon-sensitive element.

7. The protection circuit of claim 6, wherein the at least one photon-sensitive element is configured to sense a laser attack of the integrated circuit.

8. A method, comprising:
   detecting fault injection attacks of an integrated circuit;
   generating an output in response to detecting the fault injection attacks;
   progressively degrading an element including a dielectric in response to the output, the dielectric being coupled between nodes configured to receive a power supply of the integrated circuit; and
   providing a short-circuit between the nodes through the dielectric in response to the output.

9. The method of claim 8, wherein the output defines a duration and intensity of the progressive destruction and is based on a duration and intensity of the fault injection attack.

10. The protection circuit of claim 1, further comprising the integrated circuit including:
    a processor;
    a memory;
    an input/output interface;
    a bus coupled to the processor, memory, input/output interface, and the protection circuit.

11. The protection circuit of claim 10, wherein the protection circuit further comprises a charge pump coupled to the element.

12. A protection circuit, comprising:
    a detection circuit configured to detect a fault injection attack against an integrated circuit, and configured to generate an output in response to detecting the fault injection attack; and
    a countermeasure element configured to be coupled between first and second nodes configured to receive a power supply voltage of the integrated circuit, the countermeasure element configured to progressively degrade in response to the output from the detection circuit until the countermeasure element provides a short-circuit between the first and second nodes.

13. The protection circuit of claim 12, wherein the detection circuit generates a plurality of outputs over time in response to a plurality of fault injection attacks, and wherein the plurality of outputs indicate a number of the plurality of the fault injection attacks.

14. The protection circuit of claim 13, wherein the plurality of outputs further indicate a duration of the plurality of fault injection attacks.

15. The protection circuit of claim 12, wherein the countermeasure element comprises a dielectric.

16. The protection circuit of claim 15, wherein the countermeasure element comprises a field effect transistor including a gate oxide, and wherein the dielectric is the gate oxide of the field effect transistor.

17. The protection circuit of claim 12, wherein the detection circuit comprises:

at least one photon sensitive element configured to generate an electronic signal in response to photonic radiation received by the at least one photon sensitive element; and an intensity detection circuit coupled to the at least one photon sensitive element, the intensity detection circuit configured to detect an intensity of the photonic radiation based on the electronic signal, and to compare the intensity to a threshold and generate the output based on the comparison.

18. The protection circuit of claim 17 further comprising a low pass filter coupled between the at least one photon sensitive element and the intensity detection circuit.

19. The protection circuit of claim 12 further comprising:
a charge pump; and
a switch coupled between the charge pump and the countermeasure element and having a control input coupled to receive the output from the detection circuit.

20. The protection circuit of claim 12 further comprising a charge pump coupled to receive the output from the detection circuit, the charge pump further coupled to the countermeasure element.

* * * * *